US012808040B2

(12) United States Patent
Ashizawa et al.

(10) Patent No.: US 12,808,040 B2
(45) Date of Patent: Nov. 24, 2026

(54) METHOD OF PERFORMING CLEANING AND APPARATUS FOR PERFORMING SUBSTRATE PROCESSING

(71) Applicant: TOKYO ELECTRON LIMITED, Tokyo (JP)

(72) Inventors: Hiroaki Ashizawa, Nirasaki City (JP); Hirokazu Ueda, Nirasaki City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 96 days.

(21) Appl. No.: 18/539,187

(22) Filed: Dec. 13, 2023

(65) Prior Publication Data

US 2024/0200193 A1 Jun. 20, 2024

(30) Foreign Application Priority Data

Dec. 14, 2022 (JP) ................................ 2022-199294

(51) Int. Cl.

| | |
|---|---|
| ***C23C 16/44*** | (2006.01) |
| ***C23C 16/40*** | (2006.01) |
| ***C23C 16/56*** | (2006.01) |
| ***H10P 14/60*** | (2026.01) |
| ***H10P 14/692*** | (2026.01) |

(52) U.S. Cl.

CPC ........ *C23C 16/4405* (2013.01); *C23C 16/405* (2013.01); *C23C 16/56* (2013.01); *H10P 14/6334* (2026.01); *H10P 14/69392* (2026.01); *H10P 14/69395* (2026.01)

(58) Field of Classification Search

CPC .................................................. C23C 16/4405

See application file for complete search history.

(56) References Cited

U.S. PATENT DOCUMENTS 9,018,689 B1 * 4/2015 Hirochi .................. C23C 16/52
257/E21.038
2003/0216041 A1 * 11/2003 Herring .................... B08B 7/00
438/689

(Continued)

FOREIGN PATENT DOCUMENTS

| | | | |
|---|---|---|---|
| CN | 103426767 A | * | 12/2013 |
| JP | H07-086170 A | | 3/1995 |
| JP | 08199361 A | | 8/1996 |

*Primary Examiner* — Kaj K Olsen
*Assistant Examiner* — Richard Z. Zhang
(74) *Attorney, Agent, or Firm* — Nath, Goldberg & Meyer; Jerald L. Meyer; Tanya E. Harkins

(57) ABSTRACT

A method of performing a cleaning to remove a deposition film deposited during a substrate processing, includes: forming a heating film on an upper surface of the deposition film before performing the cleaning by supplying a cleaning gas to the deposition film deposited on a surface of a device arranged in a space where the substrate processing is performed, wherein the heating film undergoes a temperature increase due to a reaction heat generated when being removed by a reaction with the cleaning gas; supplying the cleaning gas to the heating film to remove the heating film and heating the deposition film on a lower surface of the heating film by the temperature increase; and performing the cleaning by supplying the cleaning gas to the deposition film having an increased temperature due to the heating the deposition film, after the heating film is removed.

14 Claims, 9 Drawing Sheets

(56) References Cited

U.S. PATENT DOCUMENTS

2005/0279384 A1* 12/2005 Guidotti .................. C23C 16/52
156/345.1
2015/0368794 A1* 12/2015 Morita ................ C23C 16/4412
118/712
2020/0035493 A1* 1/2020 Clark ................ H01L 21/28202

* cited by examiner

Reference example 1: TiN film etching

Reference example 2: TiSiN film etching

METHOD OF PERFORMING CLEANING AND APPARATUS FOR PERFORMING SUBSTRATE PROCESSING

CROSS-REFERENCE TO RELATED APPLICATION

This application is based upon and claims the benefit of priority from Japanese Patent Application No. 2022-199294, filed on Dec. 14, 2022, the entire contents of which are incorporated herein by reference.

TECHNICAL FIELD

The present disclosure relates to a method of performing a cleaning and an apparatus for performing a substrate processing.

BACKGROUND

In the manufacturing process of semiconductor devices, there are cases where metal films such as a zirconium oxide film (ZrO film) and a hafnium oxide film (HfO film) are formed. These metal films are known as high dielectric constant materials (High-K materials) and are used, for example, as a capacitor insulating film and a gate insulating film. These ZrO and HfO films are formed by supplying a processing gas containing zirconium (Zr) or hafnium (Hf) into a processing container and using a method called chemical vapor deposition (CVD) or atomic layer deposition (ALD).

During such a film forming process, a reaction product containing Zr or Hf is deposited as a deposition film on a surface of a device arranged inside the processing container. Therefore, it is necessary to clean an interior of the processing container at a set timing.

For example, in Patent Document 1, a technique has been proposed in a single-wafer-type hot wall processing apparatus in which a silicon oxide film is formed inside a processing chamber and subsequently, a $ClF_3$ gas is supplied to clean deposits adhering to an interior of the processing chamber.

PRIOR ART DOCUMENT

Patent Document

Patent Document 1: Japanese Laid-Open Patent Publication No. H07-086170

SUMMARY

According to an embodiment of the present disclosure, a method of performing a cleaning to remove a deposition film deposited during a substrate processing, includes: forming a heating film on an upper surface of the deposition film before performing the cleaning by supplying a cleaning gas to the deposition film deposited on a surface of a device arranged in a space where the substrate processing is performed, wherein the heating film undergoes a temperature increase due to a reaction heat generated when being removed by a reaction with the cleaning gas; supplying the cleaning gas to the heating film to remove the heating film and heating the deposition film on a lower surface of the heating film by the temperature increase; and performing the cleaning by supplying the cleaning gas to the deposition film having an increased temperature due to the heating the deposition film, after the heating film is removed.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

Figure 1:
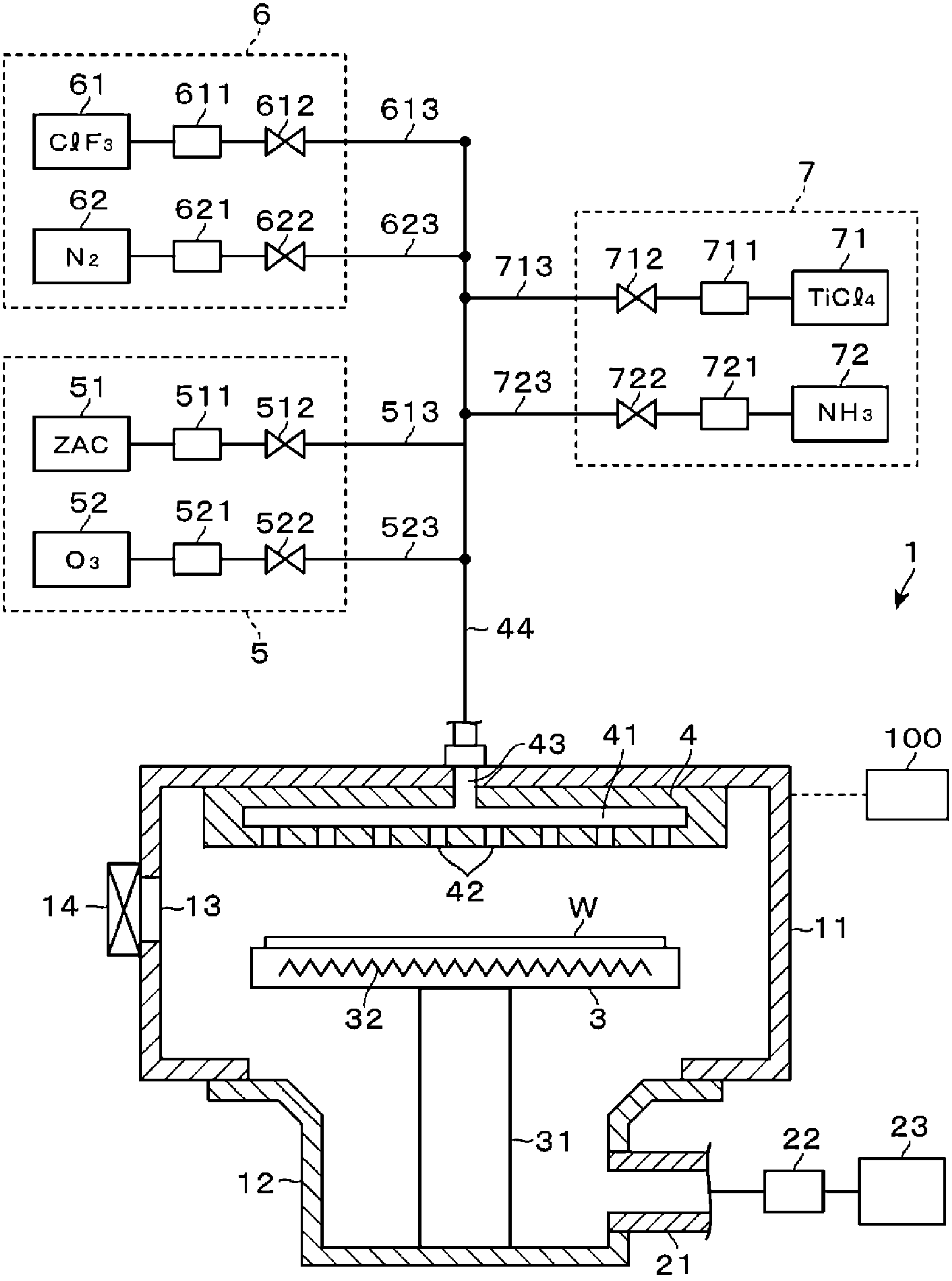
FIG. 1 is a longitudinal cross-sectional view illustrating an embodiment of an apparatus for performing a substrate processing.
Figure 2:
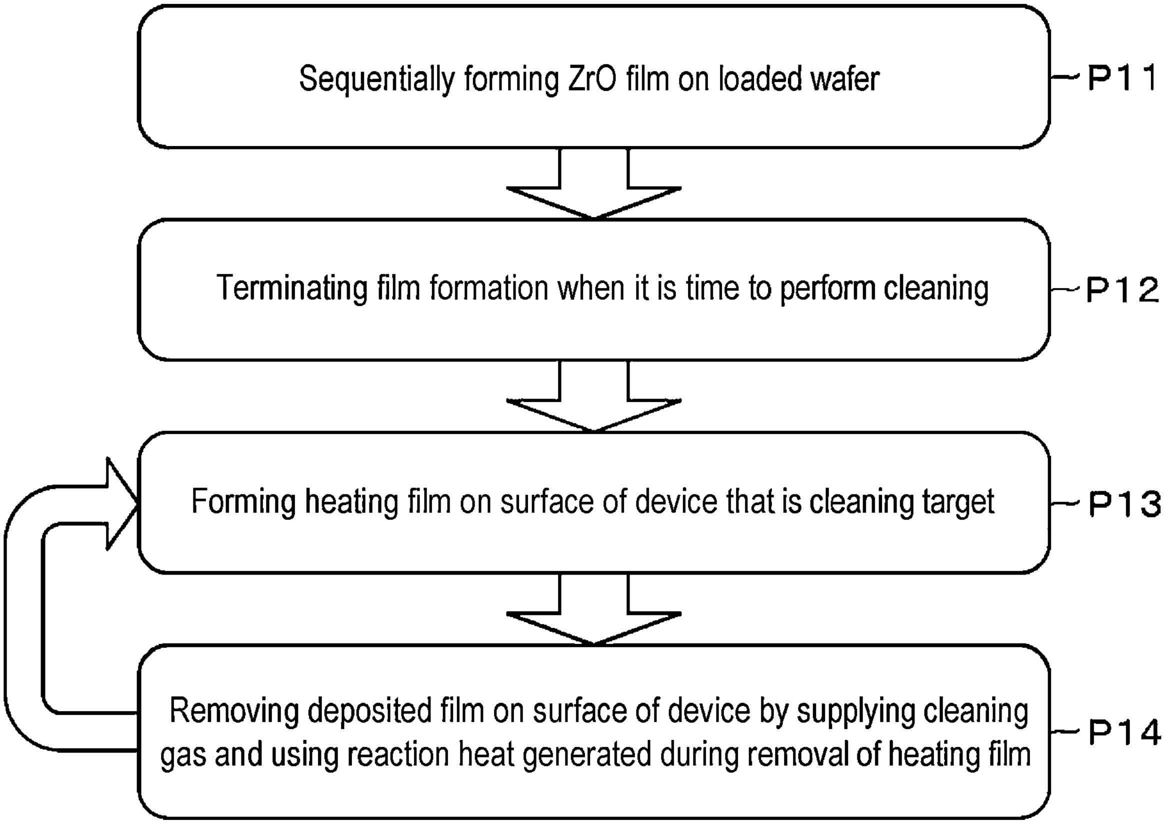
FIG. 2 is a flowchart illustrating a first embodiment of a method of performing a cleaning.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Background of Present Disclosure

In a film forming apparatus for forming a film such as a ZrO film or HfO film on a semiconductor wafer (hereinafter referred to as "wafer"), which is a substrate, a process is performed to etch away a deposition film of ZrO or HfO, which is deposited inside a processing container, by a cleaning gas. During this cleaning, a reaction product generated by a reaction between the deposition film and the cleaning gas vaporizes and is discharged from the processing container, thereby removing the deposition film. At this time, the reaction product with a higher vapor pressure is more likely to vaporize and thus, is more readily removed.

A chloride of Zr or Hf ($ZrCl_4$ or $HfCl_4$) has been known to have a relatively high vapor pressure even at a low temperature around 200 degrees C. In this respect, the applicant is considering the use of a $ClF_3$ gas as a cleaning gas to produce $ZrCl_4$ or $HfCl_4$ as a reaction product.

In order to produce $ZrCl_4$ or $HfCl_4$ with a high vapor pressure by a reaction between a $ClF_3$ gas and a ZrO film or between a $ClF_3$ gas and a HfO film, a significant activation energy is required. In general, an etching reaction exhibits a higher etching rate at a higher processing temperature. However, when setting the processing temperature to a high temperature in a range of approximately 500 degrees C. to 700 degrees C., etching rates of these ZrO and HfO films reach at most around several tens of nm/min.

On the other hand, there are cases where, for example, in a single-wafer-type film forming apparatus, a processing container made of aluminum (Al) is used. When heating the processing container in a range of 500 degrees C. to 700 degrees C. to proceed the etching reaction described above, the processing container may be damaged. Therefore, it is desirable to set the processing temperature during the cleaning to 300 degrees C. or lower, specifically 200 degrees C. or lower. When performing the cleaning on the processing container at such a low temperature, it is also conceivable to perform radical etching using a remote plasma, or dry etching using a capacitively coupled plasma (CCP).

However, in the cleaning using such plasma, the etching reaction proceeds only in a range where plasma contact occurs, which makes the cleaning difficult in a gap between members where the plasma is less likely to enter. Further, there are also cases where a plasma generation mechanism is not used in a film forming process for a ZrO film or HfO film. In this case, providing the plasma generation mechanism solely for cleaning may be a concern as it increases the apparatus cost.

As described above, in the related art, it may be difficult to perform a cleaning for removing a deposition film such as a ZrO film or HfO film by supplying a cleaning gas to the deposition film in a simplified manner.

On the other hand, the inventors of the present disclosure discovered that high temperature reaction heat is generated when using a $ClF_3$ gas to etch a metal film such as a TiN film or TiSiN film. Therefore, the present disclosure aims to promote cleaning for removing the above-described deposition film by utilizing such a reaction. In other words, the present disclosure includes forming a heating film composed of, for example, the TiN film, on an upper surface of the deposition film. Further, when consecutively etching away the heating film and the deposition film with a cleaning gas, the deposition film is removed by reaction heat generated by a reaction between the cleaning gas and the heating film.

Substrate Processing Apparatus

Hereinafter, an embodiment of an apparatus 1 for performing a substrate processing (hereinafter referred to as "substrate processing apparatus 1") according to the present disclosure will be described by taking, as an example, a case where the substrate processing is a film forming process of forming a ZrO film on a wafer.

FIG. 1 is a longitudinal cross-sectional view illustrating an embodiment of the substrate processing apparatus 1. The substrate processing apparatus 1 includes a processing container 11 having a space where a wafer W is processed. A lower portion of the processing container 11 is configured as an exhaust chamber 12. The wafer W is loaded into and unloaded from the processing container 11 by a substrate transfer mechanism (not illustrated) via a transfer port 13 for the wafer W. The transfer port 13 is formed to be able to be opened and closed by a gate valve 14. The exhaust chamber 12 is connected to a vacuum exhaust mechanism 23 via an exhaust pipe 21 provided with a pressure regulator 22. The processing container 11 and exhaust chamber 12 are made of, for example, aluminum (Al).

A stage 3 for horizontally supporting the wafer W is provided inside the processing container 11 while being supported from below by a support pillar 31. The stage 3 is made of, for example, aluminum nitride (AlN). The stage 3 includes a heater 32 provided therein and is configured to heat the wafer W to a preset temperature.

A shower head 4 made of, for example, Al, is arranged on a ceiling portion of the processing container 11 to face the wafer W placed on the stage 3. The shower head 4 has a gas diffusion space 41. A plurality of gas outlets 42 is dispersedly formed in a bottom surface of the shower head 4 in a dispersed manner.

The ceiling portion of the processing container 11 is provided with a gas inlet 43 for introducing a gas into the shower head 4. Further, the shower head 4 is connected to a processing gas supply system 5, a cleaning gas supply system 6, and a heating-film raw material gas supply system 7. A processing gas, a cleaning gas, and a heating-film forming gas are introduced respectively from the processing gas supply system 5, the cleaning gas supply system 6, and the heating-film raw material gas supply system 7 into the shower head 4 via a gas supply path 44 and the gas inlet 43.

The processing gas supply system 5 is configured to supply the processing gas for processing the wafer W to the processing container 11. The processing gas in this example is a gas for forming a ZrO film on the wafer W and includes a raw material gas containing Zr and a reaction gas for oxidizing Zr. Therefore, the processing gas supply system 5 includes a raw material gas source 51 and a reaction gas source 52. The raw material gas source 51 and the reaction gas source 52 are connected respectively to the gas supply path 44 via supply paths 513 and 523 provided with flow regulators 511 and 521 and valves 512 and 522.

For example, a gas vaporized from tri(dimethylamino) cyclopentadienylzirconium (hereinafter referred to as "ZAC") may be used as the raw material gas. Further, for example, an ozone ($O_3$) gas, which is an oxidizing gas used to oxidize ZAC, may be used as the reaction gas.

In this example, a processing gas supplier is configured to include the raw material gas source 51, the reaction gas source 52, the supply paths 513 and 523, and the gas supply path 44.

The cleaning gas supply system 6 is configured to supply the cleaning gas to the processing container 11. The cleaning gas is a gas for removing a deposition film which is deposited during the processing of the wafer W and includes a halogen compound gas. Here, a case where a $ClF_3$ gas is used as the cleaning gas will be described by way of example.

The cleaning gas supply system 6 includes a cleaning gas source 61 and a dilution gas source 62 for diluting the cleaning gas. The cleaning gas source 61 and the dilution gas source 62 are connected respectively to the gas supply path 44 via supply paths 613 and 623 provided with flow regulators 611 and 621 and valves 612 and 622. An inert gas such as a nitrogen ($N_2$) gas may be used as the dilution gas. The dilution gas is supplied as needed to adjust a concentration of the $ClF_3$ gas.

In this example, a cleaning gas supplier is configured to include the cleaning gas source 61, the supply path 613, and the gas supply path 44.

The heating-film raw material gas supply system 7 is configured to supply the heating-film forming gas for forming a heating film to the processing container 11. The heating film is a film that undergoes a temperature increase due to reaction heat generated when it is removed by a reaction with the cleaning gas. Examples of the type of heating film will be described later. Herein, a case where a titanium nitride (TiN) film is used will be described. When the heating film is the TiN film, the heating-film forming gas includes a heating-film raw material gas containing titanium (Ti) and a heating-film reaction gas for nitriding Ti. In this example of the substrate processing apparatus 1, a case where a $TiCl_4$ gas is used as the heating-film raw material gas and a $NH_3$ gas is used as the heating-film reaction gas will be described.

Therefore, the heating-film raw material gas supply system 7 includes a heating-film raw material gas source 71 and a heating-film reaction gas source 72. The heating-film raw material gas source 71 and the heating-film reaction gas source 72 are connected respectively to the gas supply path 44 via supply paths 713 and 723 provided with flow regulators 711 and 721 and valves 712 and 722.

In this example, a heating-film raw material gas supplier is configured to include the heating-film raw material gas source 71, the heating-film reaction gas source 72, the supply paths 713 and 723, and the gas supply path 44.

In addition, the configurations of the processing gas supply system 5, the cleaning gas supply system 6 and the heating-film raw material gas supply system 7 is not limited to the above example. For example, a purge gas supply path for supplying a purge gas to promote the discharge of the raw material gas, the reaction gas, and the like from the processing container 11 may be joined with each supply path 513, 523, 613, 623, 713 or 723.

Controller

The substrate processing apparatus 1 includes a controller 100 that controls an operation of each part that constitutes the substrate processing apparatus 1, such as a film forming process of forming the ZrO film or the heating film, and a cleaning process of cleaning the deposition film in the processing container 11. The controller 100 includes, for example, a computer provided with a CPU and a storage (all not illustrated). The storage stores a program incorporating a group of steps (commands) such as a step of forming the ZrO film, a step of forming the heating film, a step of heating the deposition film, and a step of performing the cleaning to remove the deposition film. This program is stored in a non-transitory computer-readable storage medium such as, for example, a hard disk, a compact disk, a magneto-optical disk, a memory card, or a non-volatile memory, and is installed in the computer from the storage medium.

First Embodiment

Next, a first embodiment of a method of performing a cleaning according to the present disclosure will be described together with actions in the substrate processing apparatus 1 with reference to FIGS. 2 and 3A to 3C.

Formation of ZrO Film

First, a film forming process of sequentially forming the ZrO film is performed on the wafer W loaded into the processing container 11 (P11).

Specifically, in the substrate processing apparatus 1, the gate valve 14 is open, and a transfer mechanism (not illustrated) which holds the wafer W is introduced into the processing container 11 via the loading/unloading port 13 and performs the transfer of the wafer W onto the stage 3. Then, the transfer mechanism is moved backward from the processing container 11, the gate valve 14 is closed, and an internal pressure of the processing container 11 and a temperature of the wafer W are regulated.

Then, a ZAC gas, which is the raw material gas, and an $O_3$ gas, which is the reaction gas, are introduced from the processing gas supply system 5 into the shower head 4 via the supply paths 513 and 523, the gas supply path 44, and the gas inlet 43. Thus, the ZAC gas and the $O_3$ gas diffuse inside the diffusion space 41 and flows out from the gas supply holes 42, thus being supplied toward the wafer W placed on the stage 3.

In this film forming process, the supply of the ZAC gas and the supply of the $O_3$ gas may be simultaneously performed when performing film formation by a CVD method.

Further, when performing film formation by an ALD method, for example, a cycle including "supplying the ZAC gas (adsorbing a precursor onto the wafer W)→supplying a purge gas→supplying the $O_3$ gas (causing the $O_3$ gas to react with the precursor adsorbed onto the wafer W)→supplying the purge gas" is repeated a predetermined number of times.

Once film formation has been performed by the CVD method or ALD method during a preset period, the supply of the ZAC gas and the $O_3$ gas is stopped. Thereafter, the wafer W on which the film formation has been performed is unloaded from the processing container 11 in the reverse order to the loading operation described above. Subsequently, the wafer W, which is a next film forming target, is loaded into the processing container 11. Similarly, the film forming process of forming the ZrO film is performed on the next wafer W. In this way, the ZrO film is formed on a plurality of wafers W in a sequential manner.

Cleaning

Subsequently, when reaching a time to perform the cleaning, the film formation is terminated (P12).

Figure 3A:
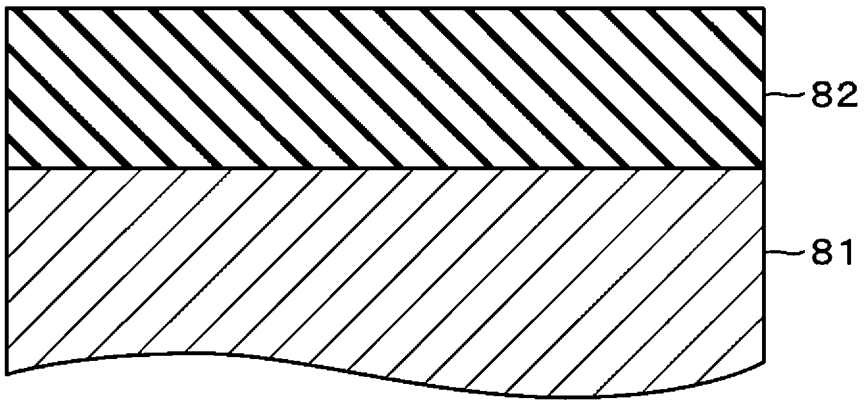
FIG. 3A is a first longitudinal cross-sectional view illustrating an action in the first embodiment.

When performing the film forming process of forming the ZrO film on the wafer W loaded into the processing container 11, as illustrated in FIG. 3A, the ZrO film is deposited not only on the wafer W but also on a surface of a device 81 arranged in a space where the film forming process is performed. Examples of the device 81 include any members on which the ZrO film is deposited by coming into contact with the processing gas, such as an inner wall of the processing container 11 and an inner wall of the exhaust chamber 12 in addition to the stage 3 and the shower head 4.

Thus, the substrate processing apparatus 1 performs the cleaning to remove a deposition film 82 at a preset time. The time to perform the cleaning is preset based on factors such as the number of wafers W on which the film forming process has been performed and a cumulative time of the film forming process. Here, a case where a time when the film forming process has been completed on 100 wafers W is set as the time to perform the cleaning will be described by way of example. At the time to perform the cleaning, a film thickness of the deposition film which has been deposited on the surface of the device 81 is, for example, 500 nm.

Then, when this time reaches, for example, a dummy wafer is loaded into the processing container 11 and is placed on the stage 3, and then the cleaning is performed. The dummy wafer is placed as needed to protect the surface of the stage 3 from the cleaning gas, which will be described later.

Formation of Heating Film

Subsequently, an operation (step) of forming a heating film 83 on an upper surface of the deposition film 82 is performed (P13). This operation is performed before supplying the cleaning gas into the processing container 11 to perform the cleaning.

Specifically, the internal pressure of the processing container 11 and the temperature of the stage 3 are regulated, respectively. Then, a $TiCl_4$ gas, which is the heating-film raw material gas, and a $NH_3$ gas, which is the heating-film reaction gas, are supplied from the heating-film raw material gas supply system 7 into the processing container 11 via the supply paths 713 and 723, the gas supply path 44, and the gas inlet 43.

In this film forming process, the supply of the $TiCl_4$ gas and the supply of the $NH_3$ gas may be simultaneously performed when performing film formation by a CVD method.

Further, when performing film formation by an ALD method, for example, a cycle including "supplying the $TiCl_4$ gas→supplying a purge gas→supplying the $NH_3$ gas (causing the $NH_3$ gas to react with $TiCl_4$ adsorbed onto the wafer W)→supplying the purge gas" is repeated a predetermined number of times.

Figure 3B:
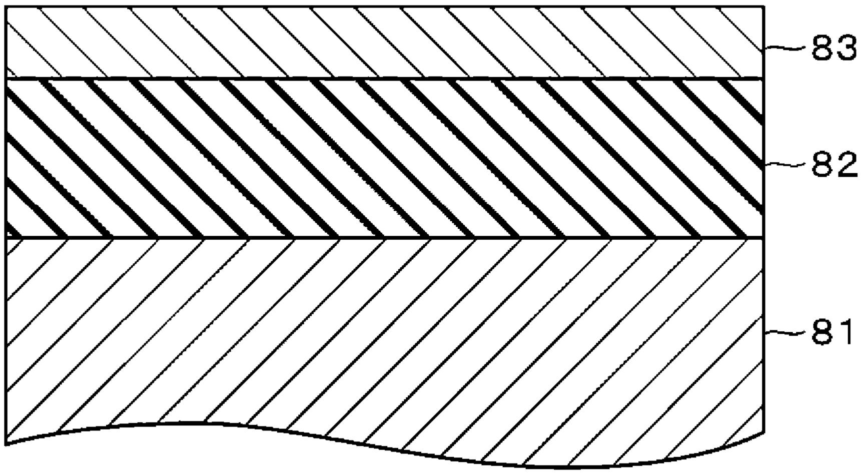
FIG. 3B is a second longitudinal cross-sectional view illustrating the action in the first embodiment.

In this way, the $TiCl_4$ gas and the $NH_3$ gas spread widely throughout an internal space of the processing container 11. As illustrated in FIG. 3B, the heating film 83 including the TIN film is formed on the upper surface of the deposition film 82 inside the processing container 11. For example, a film thickness of the heating film 83 is 500 nm. In addition, for the sake of convenience in illustration, the heating film 83 is illustrated to be thinner than the deposition film 82 in FIG. 3B.

Supply of Cleaning Gas

Subsequently, the cleaning gas is supplied into the processing container 11 to remove the heating film 83, and a process of removing the deposition film 82, which has been deposited on the surface of the device 81, is performed by reaction heat generated during the removal of the heating film 83 (P14).

Specifically, the internal pressure of the processing container 11 is regulated to a set pressure, for example, 2 Torr (266 Pa), and the temperature of the stage 3 is regulated to a temperature in a range of 150 degrees C. to 300 degrees C., for example, 200 degrees C.

Then, a $ClF_3$ gas, which is the cleaning gas, and a $N_2$ gas, which is the dilution gas, are introduced from the cleaning gas supply system 6 into the processing container 11 via the supply paths 613 and 623, the gas supply path 44, and the gas inlet 43. In this way, the $ClF_3$ gas with a concentration adjusted by the $N_2$ gas is supplied to the heating film 83. In this example, the $N_2$ gas is supplied together with the $ClF_3$ gas as the cleaning gas. The $ClF_3$ gas alone may be supplied as the cleaning gas.

When supplying the $ClF_3$ gas, the heating film 83 reacts with the $ClF_3$ gas (etching reaction) and is removed. This etching reaction proceeds at a high etching rate of several μm/min. Further, when the heating film 83 is removed by the etching reaction, high-temperature reaction heat generates. This increases the temperature of the heating film 83.

As described later, simulation results of a theoretical achieving temperature (highest temperature reached by the etching reaction) when etching the TiN film with the $ClF_3$ gas is 2,050 K. Unlike cleaning conditions and simulation conditions, it is estimated that the heating film 83 generates heat that reaches several hundred degrees, although it does not reach the theoretical achieving temperature.

Then, with the temperature increase of the heating film 83, the deposition film 82 formed in close contact with the lower surface of the heating film 83 is heated. In this way, an operation (step) of supplying the cleaning gas to the heating film 83 to remove the heating film 83 and heating the deposition film 82 on the lower surface of the heating film 83 is performed.

Figure 3C:
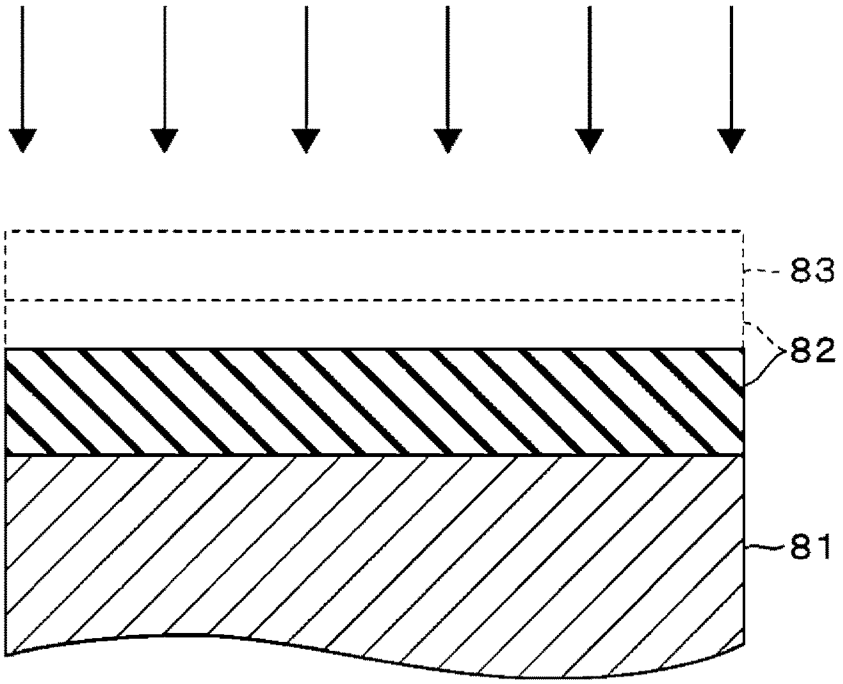
FIG. 3C is a third longitudinal cross-sectional view illustrating the action in the first embodiment.
Figure 4:
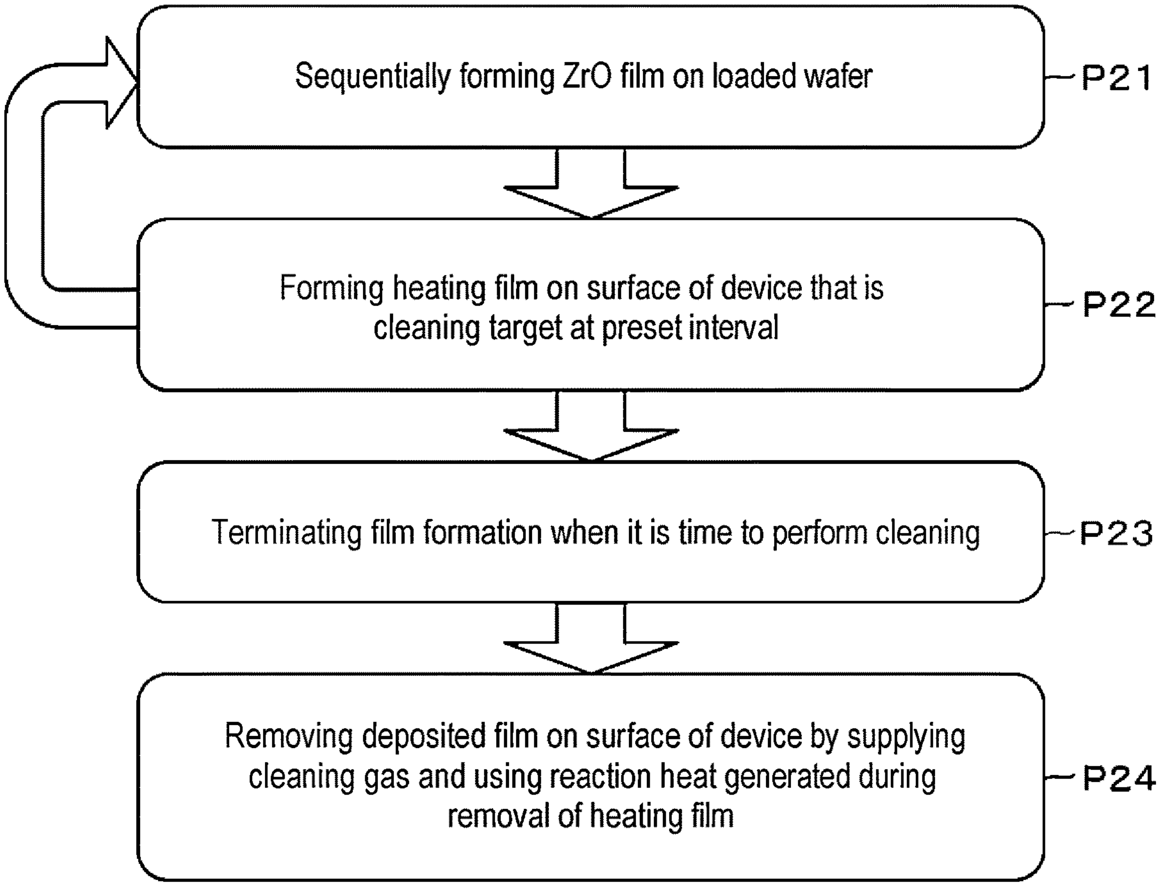
FIG. 4 is a flowchart illustrating a second embodiment of a method of performing a cleaning.

Subsequently, a cleaning operation of supplying the cleaning gas to the deposition film 82, which has been increased in temperature in the heating operation, to remove the deposition film 82, is performed. As described above, the cleaning gas is supplied to etch away the heating film 83 inside the processing container 11. Then, the deposition film 82 is heated by reaction heat generated at that time. Subsequently, as illustrated in FIG. 3C, the etching of the deposition film 82 by the cleaning gas proceeds.

As described above, the deposition film 82 has a low etching rate with the $ClF_3$ gas. However, since the cleaning gas is supplied in the state where the deposition film 82 has been heated to several hundred degrees by the heating film 83, the cleaning proceeds at a relatively high etching rate compared to a case where the deposition film is not heated.

In this way, the deposition film 82 is removed from the upper surface thereof by the cleaning. At this time, as illustrated in FIG. 3C, the deposition film 82 may not be completely removed by one round of etching and may remain. In this case, the process (P13) of forming the heating film 83 is performed again, followed by supplying the cleaning gas into the processing container 11 to perform the cleaning for removing the heating film 83 and the deposition film 82 (P14). In this way, the film formation (P13) of the heating film 83 and the removal (P14) of the heating film 83 and deposition film 82 by the cleaning gas are repeated until the deposition film 82 is removed.

Effects of First Embodiment

According to this embodiment, the heating film 83 is formed on the upper surface of the deposition film 82, and the cleaning is performed by heating the deposition film 82 using the temperature increase due to the reaction heat between the heating film 83 and the cleaning gas. Therefore, it is possible to clean the deposition film 82 at a higher temperature and to increase the etching rate of the deposition film 82 by the cleaning gas, compared to the case where the heating film 83 is not formed. Accordingly, the cleaning is performed even for the deposition film 82 composed of a ZrO film that is less prone to etching, which makes it possible to remove the deposition film 82.

Further, since the reaction heat of the heating film 83 is used to heat the deposition film 82, it is possible to locally heat an area in a thickness range near the deposition film 82. Accordingly, a temperature of a main body of the device 81 arranged inside the processing container 11 does not increase significantly, which makes it possible to suppress damage to the device 81.

In this cleaning, both the heating film 83 and the deposition film 82 are etched with the cleaning gas, but the etching rate of the heating film 83 is significantly higher than that of the deposition film 82. This may increase the total cleaning process time.

Further, the present disclosure relates to a simplified method of forming the heating film 83 on the upper surface of the deposition film 82 and etching the heating film 83 and the deposition film 82 by the same cleaning gas, which eliminates a need for a complex device such as a plasma generation mechanism. Further, the formation of the heating film 83 is performed by supplying the heating-film forming gas. The heating-film forming gas spreads throughout the interior of the processing container 11, which makes it possible to form the heating film on the upper surface of the deposition film 82 which has been deposited inside the processing container 11. Accordingly, it is possible to uniformly increase the temperature of the deposition film 82 inside the processing container 11, thereby efficiently etching away the deposition film 82.

Second Embodiment

Next, a second embodiment of the method of performing the cleaning according to the present disclosure will be described with reference to FIGS. 4 and 5A to 5C. In this embodiment, the operation of forming the heating film is performed in an intermittent manner at an interval set in a film-formation processing period during which the film formation is performed on the wafer W. A stack structure is formed by overlapping a plurality of sets of the deposition film 82 and the heating film 83 in this way. Thereafter, the films of the stack structure are etched away at once by the cleaning gas.

Formation of ZrO Film

First, a film forming process of sequentially forming a ZrO film is performed on the wafer W loaded into the processing container 11 (P21).

This film forming process is the same as that in the first embodiment, and the ZrO film is sequentially formed on a plurality of, for example, 10, wafers W.

Formation of Heating Film

Subsequently, when a preset time reaches, the wafer W on which the ZrO film has been formed is unloaded from the processing container 11. Thereafter, a dummy wafer is loaded and placed on the stage 3 as needed. Then, an operation of forming the heating film 83 on the surface of the device 81, which is a cleaning target, is performed (P22). The preset time is set based on, for example, the number of wafers W on which the film forming process has been performed, and is set to a time when the film forming process has been completed for a plurality of, for example, 10, wafers W. In this way, the operation of forming the heating film 83 is performed at an interval set in a film-formation processing period during which the film forming process is performed.

Figure 5A:
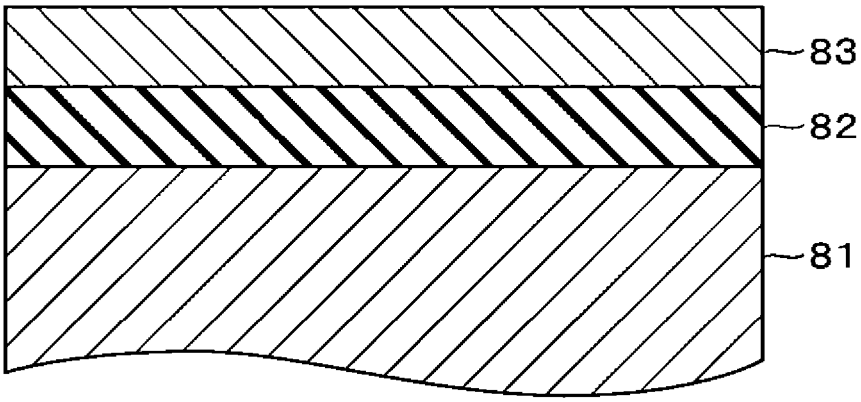
FIG. 5A is a first longitudinal cross-sectional view illustrating an action in the second embodiment.

As described above, the heating film 83 is formed at the interval set in the film-formation processing period. The ZrO film, which is thinner than that in the first embodiment as the deposition film 82, is deposited on the surface of the device 81 arranged in the space where the film forming process is performed. Thus, as illustrated in FIG. 5A, the heating film 83 is formed on the upper surface of the deposition film 82 on the surface of the device 81. The formation of the heating film 83 is the same as that in the first embodiment, but the film thickness of the heating film 83 is set to be smaller than that in the first embodiment. For example, the thickness of each of the deposition film 82 and the heating film 83 is 50 nm.

Once the heating film 83 with the set film thickness has been formed, the dummy wafer is unloaded from the processing container 11. Subsequently, the wafer W, which is a film forming target, is loaded into the processing container 11, and the film forming process of sequentially forming the ZrO film is performed (P21).

Subsequently, when the preset time reaches again, the wafer W on which the ZrO film has been formed is unloaded from the processing container 11, and then a dummy wafer is loaded and placed on the stage 3. Then, the operation of forming the heating film 83 is performed (P22).

Figure 5B:
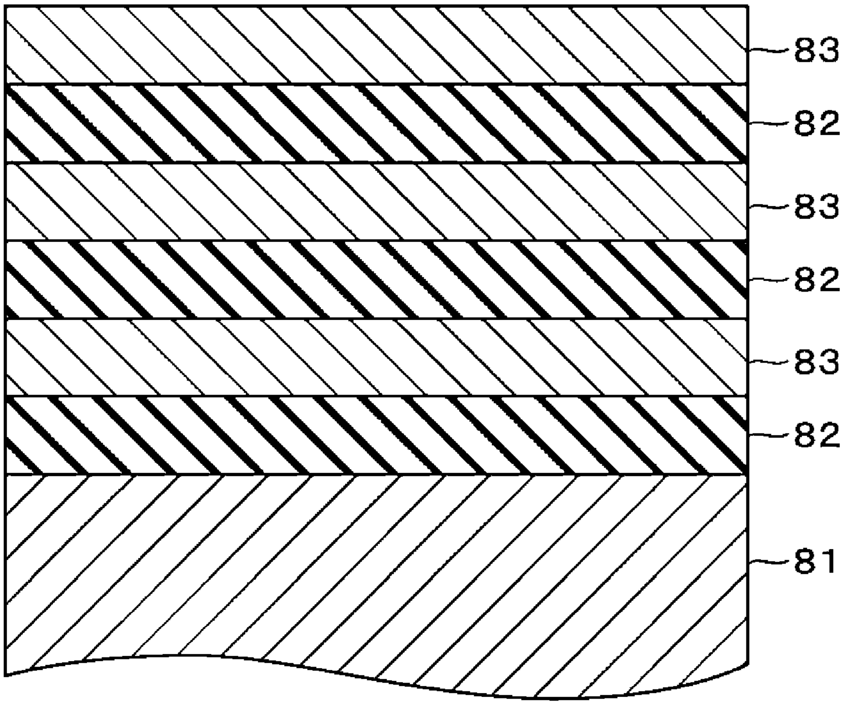
FIG. 5B is a second longitudinal cross-sectional view illustrating the action in the second embodiment.

In this way, by repeatedly performing the film forming process of forming the ZrO film (P21) and the formation of the heating film 83 (P22), the heating film 83 is formed at a preset interval in the film-forming processing period. As a result, as illustrated in FIG. 5B, a stack structure is formed by overlapping a plurality of sets of the deposition film 82 and the heating film 83.

Supply of Cleaning Gas

Subsequently, when a time to perform the cleaning reaches, the formation of the ZrO film is terminated (P23). The time to perform the cleaning is set in the same manner as in the first embodiment. After the formation of the ZrO film and the heating film 83 is formed, the cleaning is performed. In other words, as illustrated in FIG. 5B, the cleaning begins in a state where a stack structure is formed by alternately stacking the deposition film 82 and the heating film 83 and locating the heating film 83 on the uppermost layer. Then, during the cleaning, the process of supplying the cleaning gas into the processing container 11 to remove the heating film 83 and removing the deposition film 82 using the reaction heat generated during the removal of the heating film 83, is performed (P24).

Specifically, as in the first embodiment, the internal pressure of the processing container 11 is regulated to a set pressure, for example, 2 Torr (266 Pa), and the temperature of the stage 3 is regulated to a temperature in a range of 150 degrees C. to 300 degrees C., for example, 200 degrees C. Then, a $ClF_3$ gas, which is the cleaning gas and, if necessary, a $N_2$ gas, which is the dilution gas, are introduced from the cleaning gas supply system 6 into the processing container 11. By supplying the $ClF_3$ gas, the heating film 83 is removed by a reaction with the $ClF_3$ gas. The deposition film 82 on the lower surface of the heating film is heated by heat generated during this reaction. In this way, the operation (step) of removing the heating film 83 by the cleaning gas and also heating the deposition film 82 on the lower surface of the heating film 83 is performed.

Subsequently, the cleaning operation of supplying the cleaning gas to the deposition film 82 which has been increased in temperature in the heating operation, to remove the deposition film 82, is performed.

In the second embodiment, when the cleaning gas is supplied into the processing container 11, first, the heating film 83 located on the uppermost is removed by the cleaning gas. The heat generated at that time heats the deposition film on the lower surface of the heating film 83 located on the uppermost layer. Then, the deposition film 82 is etched away by the cleaning gas.

Then, once the deposition film 82 has been removed, the heating film 83 is exposed again in the interior of the processing container 11. In this way, the heating film 83 is continuously removed by the cleaning gas, and the deposition film 82 on the lower surface of the heating film 83 is heated. As a result, as illustrated in FIG. 5C, the deposition films 82 are removed while performing the etching in sequence starting from the heating film 83 located on the uppermost layer to an underlying film.

Figure 5C:
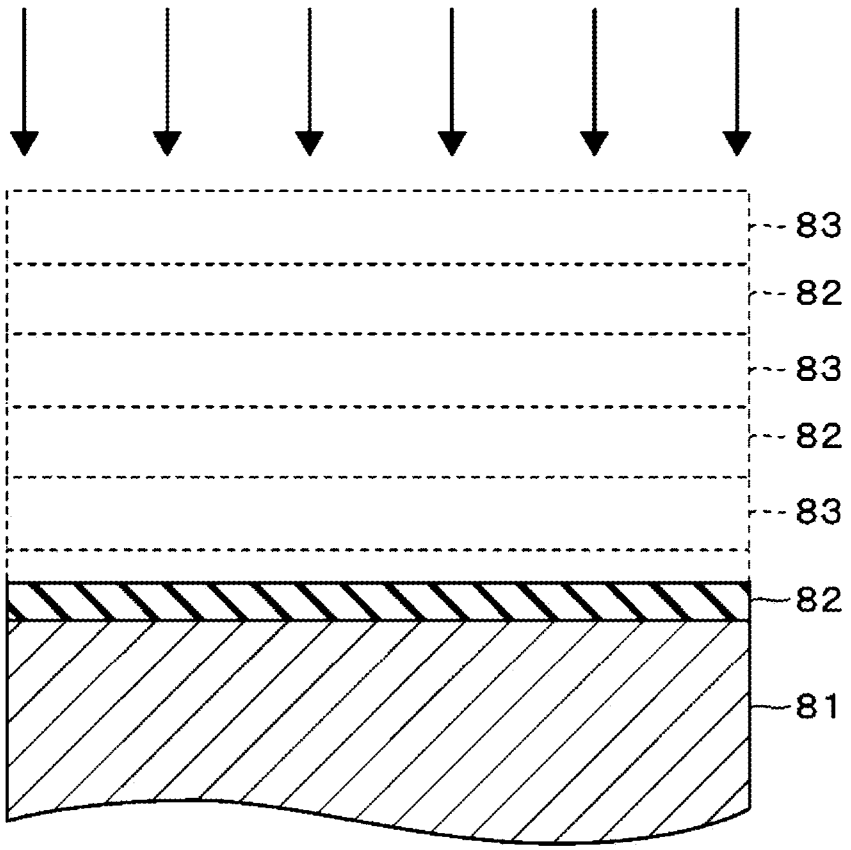
FIG. 5C is a third longitudinal cross-sectional view illustrating the action in the second embodiment.

FIG. 5C illustrates a state where a portion of the deposition film 82, which has been deposited on the surface of the device 81, remains. It is conceivable that almost all deposition films 82 may be removed by one round of cleaning by selecting the film thickness of the deposition film 82 or the type or thickness of the heating film 83. Accordingly, the film thickness of the deposition film 82 or the type or thickness of the heating film 83 may be set such that the heating film 83 provides sufficient heat to etch the underlying deposition film 82 depending on the type of cleaning gas.

Effects of Second Embodiment

In this embodiment, as in the first embodiment, the deposition film 82 is heated with the reaction heat between the heating film 83 and the cleaning gas, which makes it possible to locally heat the deposition film 82 and increase an etching rate compared to the cases where the deposition film 82 is not heated.

Further, in the processing of the wafer W, the heating film 83 is formed in an intermittent manner during the film-forming processing period so that the deposition film 82 is coated with the heating film 83 before it becomes thick. Accordingly, it is possible to etch away the heating film 83 and the deposition film 82 at once by supplying the cleaning gas during the cleaning, and to reduce the efforts and time required for purging the processing container 11 compared to the case where the cleaning gas and the film forming gas are alternately supplied.

Selection of Heating Film

As described above, the present disclosure involves performing the cleaning by heating the deposition film 82 with the reaction heat generated by the reaction between the heating film 83 and the cleaning gas. Accordingly, it is conceivable that the required reaction heat varies depending on the type or thickness of the deposition film 82 or the type of cleaning gas. There may be a case where it is necessary to select an appropriate heating film 83 to generate such reaction heat. In this regard, a relationship between the type of heating film 83 and the theoretical achieving temperature was simulated as follows.

Simulation 1

First, a simulation was conducted to calculate the theoretical achieving temperature when various types of heating films were etched with the $ClF_3$ gas. As described above, the theoretical achieving temperature is the highest temperature that a heating film theoretically reaches due to the reaction heat caused by the etching reaction between the heating film and the $ClF_3$ gas.

In the simulation, under conditions where various heating films each having a film thickness of 500 nm were formed on the stage made of AlN in an adiabatic state and are etched by the $ClF_3$ gas with a concentration adjusted by the $N_2$ gas, the initial temperature of the stage was calculated as 25 degrees C. Further, the simulation was conducted under conditions where the pressure of the processing space where the stage is arranged was 2 Torr (266 Pa) and the molar flow ratio of the $ClF_3$ gas and the $N_2$ gas was 240:2000 [kmol].

Figure 6:
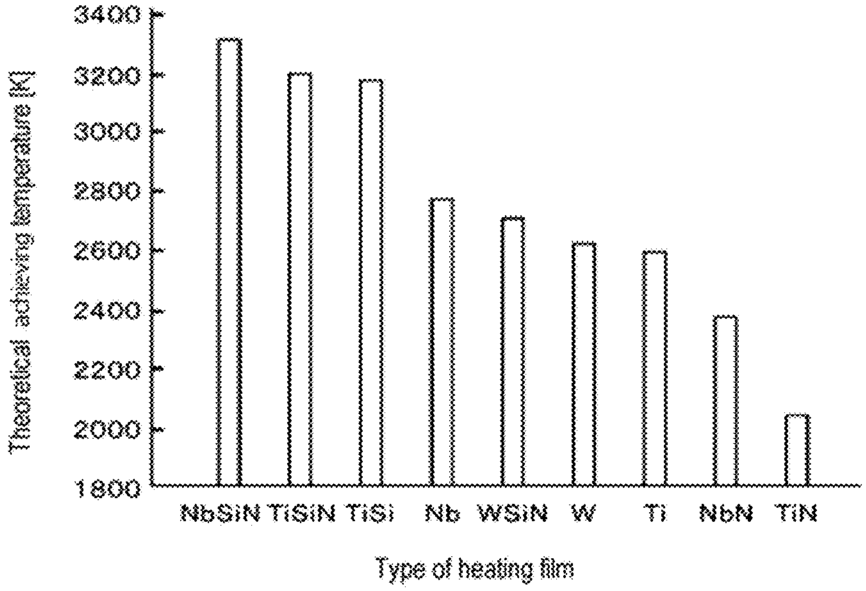
FIG. 6 is a first characteristic diagram illustrating simulation results of a theoretical achieving temperature of a heating film when the heating film is etched with a $ClF_3$ gas.

The simulation results are illustrated in FIG. 6. The horizontal axis is the type of heating film, and the vertical axis is the theoretical achieving temperature (K). As for the type of heating film, a single metal selected from a metal group consisting of titanium (Ti), tungsten (W), and niobium (Nb), or a compound containing a metal selected from this metal group and at least one of silicon (Si) or nitrogen (N), was selected. Specifically, the type of heating film is $TiSi_2$, $TisSi_3$, NbSiN, TiSiN, TiSi, $NbsSi_3$, $NbSi_2$, $WSi_{2.06}$, $WSi_2$, $Nb_3N$, $W_5Si_3$, Nb, WSiN, W, Ti, $Nb_2N$, $W_2N$, $NbN_{0.88}$, NbN, $TiN_{0.66}$, or TiN. In addition, in FIG. 6, 9 types of films among the heating films used in the simulation are described.

The simulation results showed that the theoretical achieving temperature of the heating film due to the $ClF_3$-based etching, ranked from highest to lowest, are as follows: $TiSi_2$>$Ti_5Si_3$>NbSiN>TiSiN>TiSi>$Nb_5Si_3$>$NbSi_2$>$WSi_{2.06}$>$WSi_2$>$Nb_3N$>$WSi_3$>Nb>WSiN>W>Ti>$Nb_2N$>$W_2N$>$NbN_{0.88}$>NbN>$TiN_{0.66}$>TiN. The theoretical achieving temperature was 3,200 K for the TiSiN film, and was 2,050 K for the TiN film.

As described above, it is understood that the heating film, which is made of a single metal selected from a metal group consisting of Ti, W, and Nb, or a compound containing a metal selected from this metal group and at least one of Si or N, generates significant reaction heat by the etching reaction with the $ClF_3$ gas. In practice, it has been confirmed that several hundred degrees of heat is generated, for example, when etching Ti, W, TiSiN, or WSi with the $ClF_3$ gas.

Accordingly, for example, when a high etching rate is required at a high temperature, the heating film 83 with a relatively high heat rate may be selected depending on the type of deposition film 82. Further, even for the same type of heating film 83, by increasing the film thickness, it is possible to ensure the relatively high heat rate and increase the etching rate. In this way, the type or thickness of the heating film 83 may be appropriately selected depending on the cleaning type of deposition film 82. Accordingly, the first and second embodiments have been described by an example in which the TiN film is used as the heating film and the film thicknesses of the deposition film 82 and the heating film 83 are equal to each other, but are not limited to this example. The film thickness of the heating film 83 may be appropriately set depending on the type of heating film 83, the type of deposition film 82 to be etched, or the type of cleaning gas.

Simulation 2

Next, a simulation was conducted to calculate the theoretical achieving temperature when heating films composed of TiN and SiN were etched with the $ClF_3$ gas.

In this simulation, under conditions where the heating films each having a film thickness of 500 nm were formed on the stage made of AlN in an adiabatic state and were etched with the $ClF_3$ gas, the initial temperature of the stage was calculated as 25 degrees C. Further, the simulation was conducted under conditions where the pressure of the processing space where the stage is arranged was 266 Pa, the concentration of the $ClF_3$ gas was 9%, and the flow rate of the $ClF_3$ gas was 200 sccm.

Figure 7:
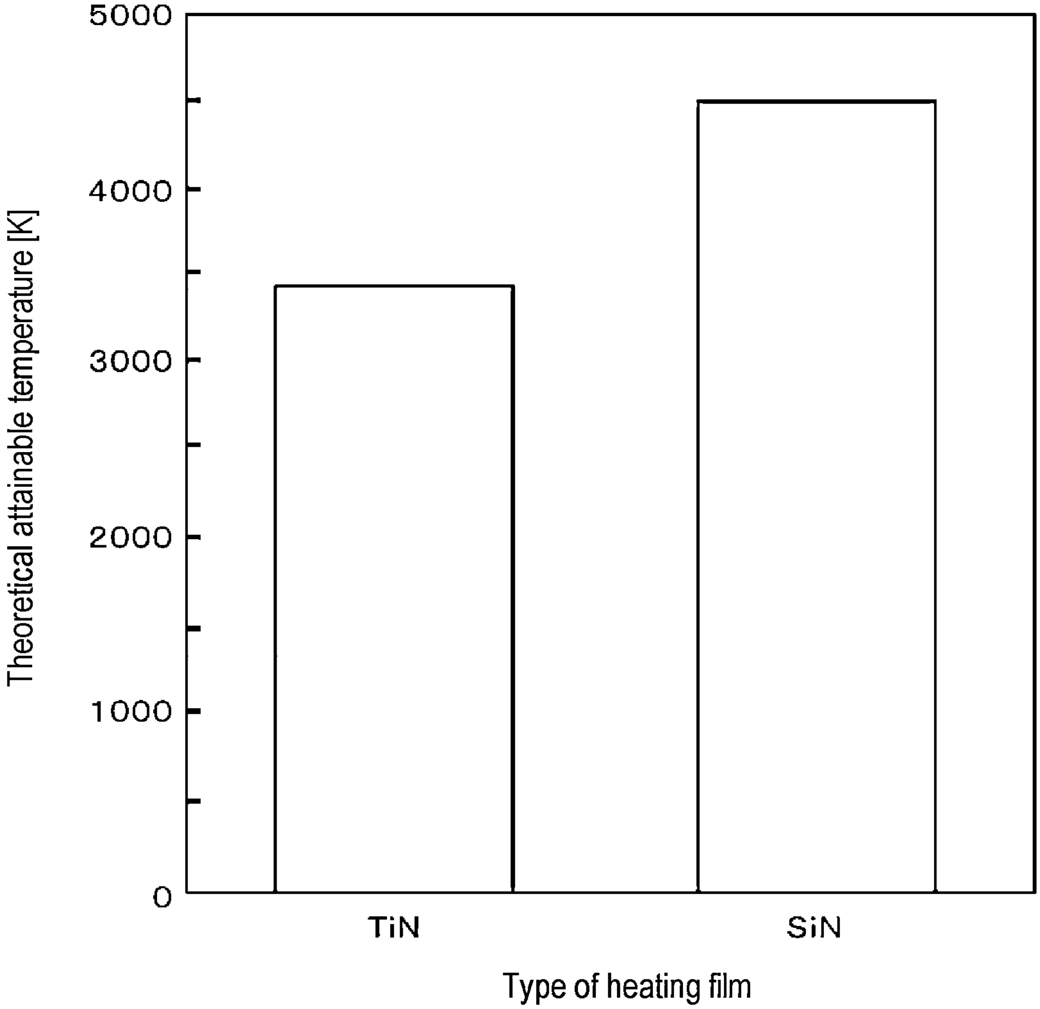
FIG. 7 is a second characteristic diagram illustrating the simulation results of the theoretical achieving temperature of a heating film when the heating film is etched with a $ClF_3$ gas.

The simulation results are illustrated in FIG. 7. In FIG. 7, the horizontal axis is the type of heating film, and the vertical axis is the theoretical achieving temperature (K). It was found from the results that SiN has a higher theoretical achieving temperature compared to TiN, and generates significant reaction heat due to the etching reaction with the $ClF_3$ gas. In addition, in Simulations 1 and 2, the difference in the theoretical achieving temperature of TiN between 2,050 K and 3,500 K is due to variations in etching conditions such as the concentration of the $ClF_3$ gas.

Figure 8:
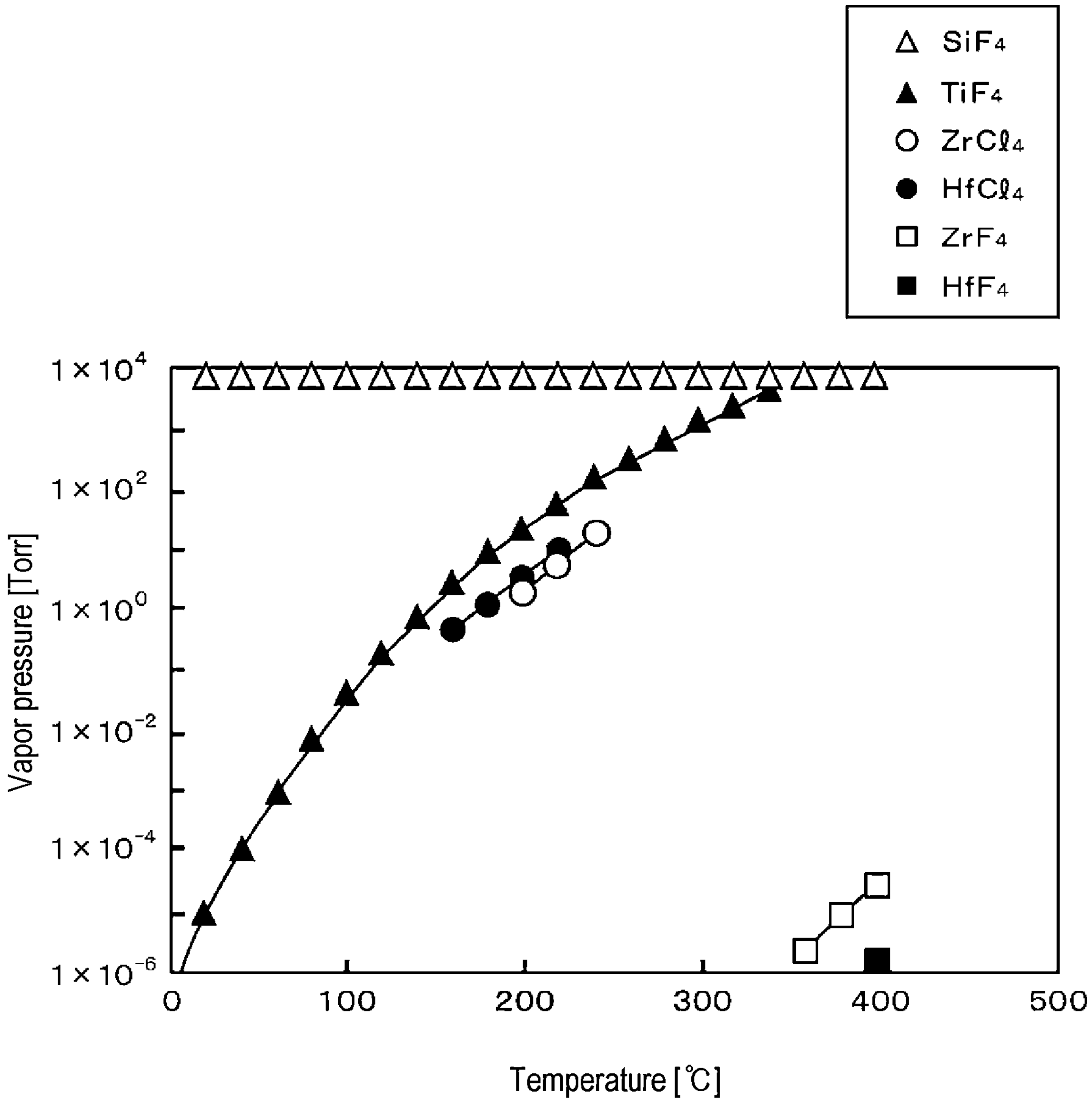
FIG. 8 is a characteristic diagram illustrating a vapor pressure curve of a reaction product when the heating film is etched with the $ClF_3$ gas.

Further, FIG. 8 illustrates vapor pressure curves of reaction products ($SiF_4$ and $TiF_4$) when etching heating films composed of the SiN film and the TiN film with the $ClF_3$ gas, reaction products ($ZrCl_4$ and $HfCl_4$) when etching ZrO and HfO films with the $ClF_3$ gas, and by-products ($ZrF_4$ and $HfF_4$) thereof, respectively. FIG. 8 is a partial logarithmic graph with temperature on the horizontal axis and vapor pressure (Torr) on the vertical axis. The data is represented as follows: Δ for $SiF_4$, ▲ for $TiF_4$, ○ for $ZrCl_4$, ● for $HfCl_4$, for $ZrF_4$, and ■ for $HfF_4$.

In FIG. 8, for the sake of convenience in illustration, the vapor pressure of $SiF_4$ is plotted with a value of $1.0\times10^4$ Torr in a range of 0 degrees C. to 400 degrees C., but the actual vapor pressure of $SiF_4$ is $2.8\times10^4$ Torr($3.7\times10^6$ Pa). As described above, it can be seen that $SiF_4$ has an extremely high vapor pressure and is highly likely to vaporize. Accordingly, it is understood that when using a SiN film as the heating film, the etching of the heating film proceeds rapidly by cleaning using the $ClF_3$ gas, and the deposition film may be sufficiently heated, as evident from the results of Simulation 2. Further, it can be anticipated that it is easier to vaporize $ZrF_4$ or $HfF_4$ with low vapor pressures, for example, if sublimation and vaporization of $SiF_4$ occur together, given the extremely high vapor pressure of $SiF_4$.

Further, it can be seen that the vapor pressure of $TiF_4$ is $1\times10^2$ Torr($1.3\times10^4$ Pa) at 200 degrees C., and is higher than the vapor pressure (10 Torr ($1.3\times10^3$ Pa)) of $ZrCl_4$ or $HfCl_4$ at 200 degrees C., and thus, $TiF_4$ is likely to vaporize. As already described, it is recognized that the high etching rate of the TiN film with the $ClF_3$ gas, which is several μm/min, means that, even when the TiN film is used as the heating film, the etching of the heating film proceeds rapidly, ensuring sufficient heating of the deposition film.

Reference Example

Figure 9A:
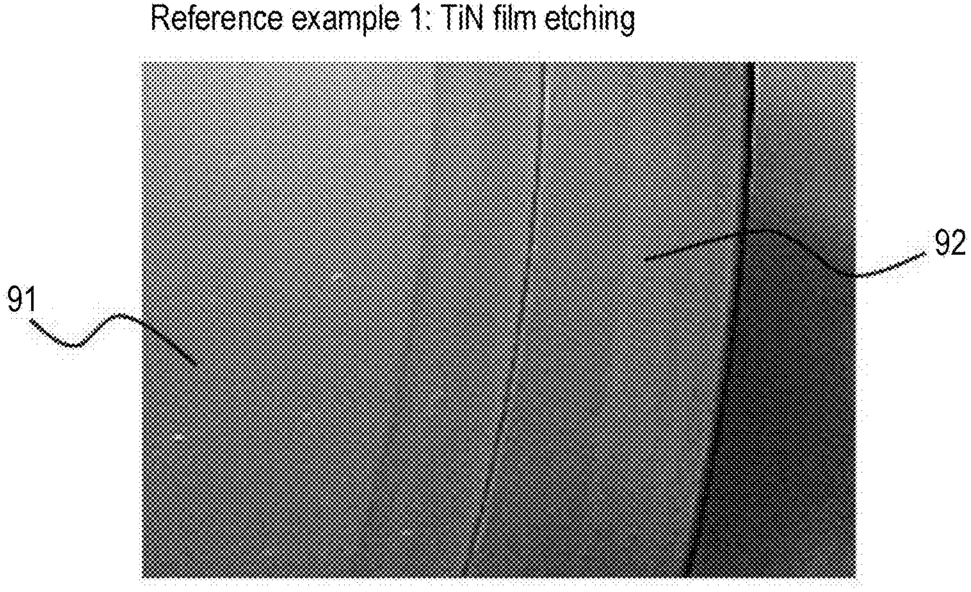
FIGS. 9A and 9B are images illustrating capturing results of a surface of the stage when the heating film formed on a stage is etched with the $ClF_3$ gas.
Figure 9B:
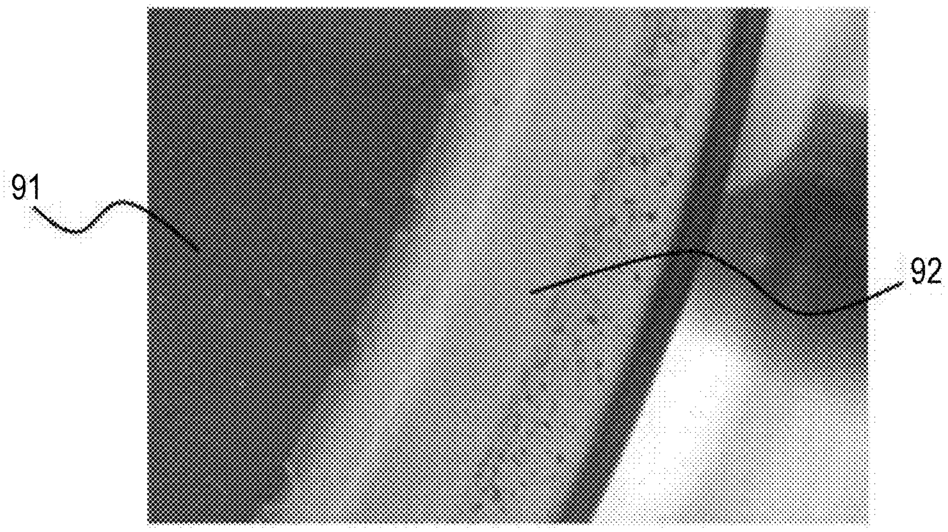

FIGS. 9A and 9B illustrate images obtained by capturing a surface of an AlN-made stage 3 in the substrate processing apparatus 1 as illustrated in FIG. 1 when performing the film forming process of forming heating films (TiN film and TiSiN film) and then cleaning using the $ClF_3$ gas.

In this process, a dummy wafer was placed on the stage 3, and the TiN film and the TiSiN film each having a film thickness of 500 nm were formed. Then, the internal pressure of the processing container 11 was set to 266 Pa, the temperature of the stage was set to 200 degrees C., and the $ClF_3$ gas was supplied to perform cleaning. At this time, the concentration of the $ClF_3$ gas was 9% and the flow rate thereof was 200 sccm. Then, the dummy wafer was unloaded after the cleaning, and then, the image of the surface of the stage 3 was captured.

The image of the surface of the stage 3 after the cleaning in the case where the TiN film is formed are illustrated in FIG. 9A, and the image of the surface of the stage 3 after the cleaning in the case where the TiSiN film is formed are illustrated in FIG. 9B. In FIGS. 9A and 9B, reference numeral 91 denotes a placement area for a dummy wafer, and reference numeral 92 denotes an outer peripheral area of the placement area 91. It was confirmed that the surface of the peripheral area 92 of the stage in FIG. 9B is shaved and roughened rather compared to FIG. 9A.

It can be seen from these images that when performing the cleaning on the TiN and TiSiN films using the $ClF_3$ gas under the same conditions, the TiSiN film undergoes etching more readily than the TiN film, and thus, not only the TiSiN film but also the surface of the AlN-made stage are etched. From this, it was confirmed that in the etching reaction using the $ClF_3$ gas, a heat generation reaction with an extremely high temperature occurs when the TiSiN film is etched. Further, since the AlN-made stage below the TiSiN film is also etched, it is estimated that, even if an underlying layer of the TiSiN film is a ZrO film or a HfO film, the etching activity is increased, thus promoting the etching reaction.

In the above, the film formed by the film forming process may be a HfO film. In this case, for example, tri(dimethylamino)cyclopentadienylhafnium, which is a raw material gas, and an $O_3$ gas, which is a reaction gas, are supplied from the process gas supply system into the processing container 11, and a film forming process of forming the HfO film is performed by a CVD method or ALD method.

However, the film forming process of forming the ZrO film or the HfO film is not limited to the above-described example, and gases different from that in the above-described example may be used as the raw material gas and the reaction gas.

Further, the substrate processing in the present disclosure is not limited to the film forming process of forming the ZrO film or the HfO film but may be a process of forming other films on the substrate. Further, the substrate processing is not limited to the film forming process but may be an etching process. When the substrate processing is an etching process, a deposition substance deposited with the substrate processing is one obtained when a reaction product generated during the etching process is deposited.

Further, as described above, the cleaning gas may include a gas containing a halogen compound, or may include a gas containing at least one halogen compound selected from a halogen compound group consisting of $ClF_3$, HF, and $NF_3$. In addition, other cleaning gases such as $SF_6$, $CF_4$, $CHF_3$, $C_4F_8$, $Cl_2$, and $BCl_3$ may also be used.

According to the present disclosure, it is possible to perform a cleaning for removing a deposition film by supplying a cleaning gas to the deposition film deposited during a processing of a substrate.

The embodiments disclosed herein should be considered to be exemplary and not limitative in all respects. The above embodiments may be omitted, replaced or modified in various embodiments without departing from the scope of the appended claims and their gist.

What is claimed is:

1. A method of performing a cleaning to remove a deposition film deposited during a substrate processing which is performed on a substrate mounted on a stage, the deposition film deposited on a surface of a device arranged in a space where the substrate processing is performed, the method comprising:

placing a dummy wafer on the stage after the substrate processing is terminated and the substrate, for which the substrate processing has been terminated, is removed;

forming a heating film on an upper surface of the deposition film by supplying a heating film forming gas after the dummy wafer is placed on the stage;

supplying a cleaning gas to the heating film to remove the heating film, wherein the heating film undergoes a temperature increase due to a reaction heat generated by a reaction between the heating film and the cleaning gas, thereby heating the deposition film on a lower surface of the heating film by the temperature increase; and supplying the cleaning gas to the deposition film having an increased temperature due to the heating the deposition film to thereby remove the deposition film after the heating film is removed.

2. The method of claim 1, wherein the forming the heating film is performed in an intermittent manner at an interval set in a period of time during which the substrate processing is sequentially performed on a plurality of substrates while exchanging a processing target.

3. The method of claim 1, wherein the cleaning gas includes a halogen compound gas.

4. The method of claim 3, wherein the cleaning gas includes a gas containing at least one halogen compound selected from a halogen compound group consisting of $ClF_3$, HF, and $NF_3$.

5. The method of claim 1, wherein the heating film is a single metal selected from a metal group consisting of Ti, W, and Nb, or a compound containing a metal selected from the metal group and at least one of Si or N, or SiN.

6. The method of claim 1, wherein the substrate processing is a film forming process of forming a film on the substrate.

7. The method of claim 6, wherein the film formed by the film forming process is a zirconium oxide film or a hafnium oxide film.

8. An apparatus for performing a processing of a substrate, comprising:

a processing container provided in a space where the processing is performed;

a stage arranged inside the processing container to place the substrate on the stage;

a processing gas supplier configured to supply, to the processing container, a processing gas for processing the substrate;

a cleaning gas supplier configured to supply, to the processing container, a cleaning gas for removing a deposition film deposited on a surface of a device arranged inside the processing container during the processing of the substrate;

a heating-film raw material gas supplier configured to supply, to the processing container, a heating-film forming gas for forming a heating film that undergoes a temperature increase due to a reaction heat generated when being removed by a reaction with the cleaning gas; and a controller, wherein the controller is configured to output a control signal for executing the method according to claim 1.

9. The apparatus of claim 8, wherein the controller is configured to output a control signal in an intermittent manner so as to perform the step of forming the heating film at an interval set in a period of time during which the substrate processing is sequentially performed on a plurality of substrates while exchanging a processing target.

10. The apparatus of claim 8, wherein the cleaning gas includes a halogen compound gas.

11. The apparatus of claim 10, wherein the cleaning gas includes a gas containing at least one halogen compound selected from a halogen compound group consisting of $ClF_3$, HF, and $NF_3$.

12. The apparatus of claim 8, wherein the heating film is a single metal selected from a metal group consisting of Ti, W, and Nb, or a compound containing a metal selected from the metal group and at least one of Si or N, or SiN.

13. The apparatus of claim 8, wherein the processing of the substrate is a film forming process of forming a film by supplying the processing gas as a film forming gas to the substrate.

14. The apparatus of claim 13, wherein the film formed by the film forming process is a zirconium oxide film or a hafnium oxide film.

* * * * *